United States Patent [19]
Aoki

[11] Patent Number: 5,623,293
[45] Date of Patent: Apr. 22, 1997

[54] CONTACT ELECTRODE CONNECTOR

[75] Inventor: Nobuo Aoki, Nagoya, Japan

[73] Assignee: Brother Kogyo Kabushiki Kaisha, Nagoya, Japan

[21] Appl. No.: 249,965

[22] Filed: May 27, 1994

[30] Foreign Application Priority Data

May 28, 1993 [JP] Japan .................................. 5-127399
Oct. 26, 1993 [JP] Japan .................................. 5-266907

[51] Int. Cl.$^6$ ...................................................... B41J 2/14
[52] U.S. Cl. ............................................................ 347/50
[58] Field of Search ................................. 347/49, 50, 86, 347/197, 214; 400/175; 346/139 R

[56] References Cited

U.S. PATENT DOCUMENTS

| | | | |
|---|---|---|---|
| 4,905,019 | 2/1990 | Vonasek | 347/94 |
| 4,907,018 | 3/1990 | Pinkerpell et al. | 346/139 R |
| 5,359,357 | 10/1994 | Takagi et al. | 347/49 |
| 5,365,255 | 11/1994 | Inoue et al. | 347/45 |

FOREIGN PATENT DOCUMENTS

| | | |
|---|---|---|
| 53-12138 | 4/1978 | Japan . |
| 61-59914 | 12/1986 | Japan . |
| 62-234942 | 10/1987 | Japan . |
| 63-247051 | 10/1988 | Japan . |
| 3-101944 | 4/1991 | Japan . |

Primary Examiner—Mark J. Reinhart
Attorney, Agent, or Firm—Oliff & Berridge

[57] ABSTRACT

A cam follower of a cam follower member of a print head is inserted into a aperture of a carriage. Next the print head is rotated clockwise 90° in relationship to the carriage on the axis of the shaft. The cam follower is brought into engagement with cams provided to the interior of the aperture by rotation of the print head. As the cam follower follows the cams with rotation of the print head, the print head is pulled closer to the carriage. A plurality of contact electrodes provided to the print head are rubbingly brought into contact with corresponding counter electrodes provided to the carriage when the print head is rotated 90°. An air chamber can be provided under the contact electrodes for evenly distributing between all the contact electrodes and the counter electrodes pressure applied therebetween.

32 Claims, 10 Drawing Sheets

POINT C

θ = 90°

5,623,293

CONTACT ELECTRODE CONNECTOR

BACKGROUND OF THE INVENTION

1. Field of the Invention

The present invention relates to a printer and more particularly to the printer having a plurality of contact electrodes and a plurality of contact electrodes that correspond to the contact electrodes, wherein the contact electrodes and corresponding counter electrodes are brought into electrical connection by being pressed together.

2. Description of the Related Art

Japanese Patent Application Kokai No. HEI-3-101944, for example, describes a type of contact electrode connector used in an ink jet printer. The contact electrode connector is for connecting a print head to a flexible circuit.

The print head of an ink jet printer includes a plurality of ink droplet generators. The ink droplet generators are provided aligned in a surface of the print head. Each ink droplet generator includes a nozzle, an ink chamber, a thermal resistor, and an ink supply channel. The nozzles of the ink droplet generators appear aligned along the surface of the print head. Each nozzle is provided to its corresponding ink chamber so as to bring the ink chamber into fluid connection with the atmosphere. Each ink supply channel is formed in a wall of its corresponding chamber. Each thermal resister is formed in another wall of its corresponding chamber.

When a voltage is applied to a thermal resistor, the energized thermal resistor generates heat. The head vaporizes ink that fills the ink chamber and that is in contact with the thermal resistor. The vaporized produces an expanding bubble that forces ink from the nozzle by the force of its expansion. By selectively energizing thermal resistors provided to the plurality of ink droplet generators in the print head, ink droplets can be produced on demand. To print an image on a recording sheet scanningly transported in front of the print head, the thermal resistors are selectively energized according to print information from, for example, a central processing unit (CPU) in the printer.

Typically, the print head is integrally provided with an ink tank to form an ink cartridge. The ink tank is for storing ink to be supplied to ink droplet generators via the ink channels. The ink cartridge is provided to a carriage capable of reciprocally scanning across the widthwise surface of the sheet to be recorded on. The ink cartridge is provided detachably to the carriage to enable replacement of the ink cartridge when ink stored in the ink tank is used up. A flexible circuit formed on a flexible resin substrate is provided for transmitting print information from the CPU to the print head. A plurality of contact electrodes are provided to the surface of the flexible circuit. A plurality of counter electrodes are provided to the surface of the print head at positions corresponding to positions of the contact electrodes. The contact electrodes and the counter electrodes are for electrically connecting the print head of a replacement ink cartridge with the flexible circuit.

Japanese Patent Application Kokai No. SHO-62-234942 describes a contact electrode connector for providing electrical connection between thermal resistors in a print head and a CPU in a printer. As shown in FIG. 1, the contact electrode connector includes a print head portion 63, a flexible circuit portion 53, and a carriage portion 76.

The print head portion 63 includes a rigid head substrate 60 and counter electrodes 62 formed thereto. The counter electrodes 62 are for transmitting pulses of voltage to the thermal resistors (not shown) in the print head.

The flexible circuit portion 53 includes a flexible substrate 50, protruding portions 51 formed in the flexible substrate 50, and contact electrodes 52, one contact electrode being formed to each protruding portion 51. The protruding portions 51 are formed at positions in the flexible substrate 50 corresponding to positions of the counter electrodes 62 in the head substrate 60. The protruding portions 51 support corresponding contact electrodes 52 above the surrounding level surface of the flexible circuit portion 53. Each protruding portion 52 has a concave underside opposite the surface on which the corresponding electrode is formed.

The back up member 76 includes a support plate 70 and rubber protrusions 77 formed to the surface of the support plate 70. The support plate 70 is provided to a carriage (not shown) of the printer. The rubber protrusions are provided at positions corresponding to positions of the protruding portions 51 so as to abut the concave underside of corresponding protruding portions 51.

As shown in FIG. 1, when the contact electrode connector is assembled into the connected condition, the flexible circuit portion 53 is sandwiched between the head substrate 60 and the support plate 70 so that the contact electrodes 52 are brought into contact with corresponding counter electrodes 62. The rubber protrusions 77 abut the back surface of the protruding portions 51, thereby pressing the contact electrodes 52 against their corresponding counter electrodes 62.

However, there has been know a problem with replaceable ink cartridges in that a user can damage the contact terminal connector by applying excessive force when replacing the ink cartridge. For example, the protruding portions 51 can be plastically crushed if the counter electrodes 62 and the contact electrodes 52 are pressed together with excessive force. This is especially a problem when the protruding portions 51 are not properly aligned with corresponding rubber protrusions 77.

Electrical contact between a contact electrode 52 and its corresponding counter electrode 62 is usually formed at the tip point of the contact electrode 52. The tip point of a contact electrode corresponds to the tip of the protruding portion 51 that protrudes furthest from the surrounding level surface. However, when the contact electrodes 52 can move relative to and therefore abrade against corresponding counter electrodes 62, for example, during movement of the carriage or replacement of the ink cartridge. Because contact electrodes 52 contact corresponding counter electrode 62 at only a single tip point, they are less durable and so can be worn down more quickly.

When, as described above, the protruding portions 51 of the flexible circuit 53 are crushed, or the contact electrodes 52 damaged or abraded, electric contact between the contact electrodes 52 and corresponding electrodes 62 can become defective. Defective electric contact prohibits application of voltage to the thermal resistors in the head so that corresponding drop generators can not be caused to eject ink droplets on demand. Therefore, the flexible circuit 53 must be replaced when the contact electrodes 52 are damaged or abraded. However, because the flexible circuit 53 is fixed to the printer, the user must hire a professional no replace the flexible circuit 53. This repair can be expensive. This becomes a problem not only with ink cartridges wherein the head and the ink tank are integratedly formed, but with all replaceable heads.

Another problem leading to possible poor contact between the contact electrodes 52 and corresponding counter electrodes 62 is caused by excess variation in the amount at which protruding portions 51 are raised above the surrounding level surface of the flexible substrate 50. Although slight variation in the height of protruding portions 51 can be absorbed by deformation of the protruding portions 51, stress to the support plate 70 increases radically in a non-linear fashion relative to the amount of deformation. Because of this, when the variation in height of the contact electrodes exceeds a certain amount, some contact electrodes will bear an extremely large stress while others will bear almost none. The contact electrodes bearing very little stress often are sources of poor or defective contact.

Poor or defective contact between corresponding contact electrodes and counter electrodes can also occur when the resin substrate of the flexible circuit plastically deforms during production of the protruding portions.

SUMMARY OF THE INVENTION

It is therefore, an object of the present invention to overcome the above-described drawbacks, and to provide a contact electrode connector wherein contact problems caused by poor contact between contact electrodes and counter electrodes caused by abrasion between the contact electrodes and the counter electrodes are prevented so that costs for professionally repairing the printer are reduced. Also, the possibility of accidentally damaging the contact terminal connector by applying too much force is reduced even when the protruding portions of the back up member are not properly aligned or when too great a variation in height exists between the protruding portions supporting the contact electrodes. Also, poor or defective contact between contact electrodes and counter electrodes caused by too great a variation in height exists between the protruding portions supporting the contact electrode is prevented.

To achieve the above objectives, in a first aspect of the present invention a contact electrode connector comprises a first electrode portion, a first plurality of electrodes, a cam, a second electrode portion, a cam follower member, and a second plurality of electrodes. The first electrode portion has a first electrode surface, a cam surface, and an aperture surface. The first electrode surface and the cam surface are on opposite sides of the first electrode portion. The aperture surface defines an aperture in the first electrode portion and connects the first electrode surface and the cam surface. The first plurality of electrodes are provided to first electrode positions on the first electrode surface. The cam is provided to the cam surface. The second electrode portion has a second electrode surface. The cam follower member has a shaft and a cam follower. The shaft has an end and an opposite end. The end of the shaft is attached to the second electrode surface. The cam follower is attached to the opposite end of the shaft. The cam follower member is shaped so that the cam follower is insertable through the aperture when the first electrode portion and the second electrode portion are in an insertion posture, and so that, after insertion through the aperture, the cam follower will follow a surface of the cam when the first electrode portion and the second electrode portion are moved from the insertion posture to a coupled posture. The first electrode surface move towards the second electrode surface as the cam follower follows the surface of the cam. The second plurality of electrodes are provided on the second electrode surface at second electrode positions that correspond to the first electrode positions when the first electrode portion and the second electrode portion are in a coupled posture. Each electrode of the second plurality electrodes rubbingly comes into contact with a corresponding electrode of the second plurality of electrodes when the first electrode portion and the second electrode portion move into the coupled posture.

According to a second aspect of the present invention, a contact electrode connector is provided for bringing each of a first plurality of electrodes into electrical contact a corresponding electrode of a second plurality of electrodes when the contact electrode connector is in a connected condition. The contact electrode connector includes a support member, a fluid chamber partition, a plurality of protruding portions, and a substrate surface. The fluid chamber partition is formed on the support member from a resilient material. The fluid chamber partition has an outer surface and an inner surface. The inner surface defines a fluid chamber filled with a fluid. The outer surface includes a protruding portions surface and a support member confronting surface on opposite sides of the fluid chamber. The support member confronting surface confronts the support member. The plurality of protruding portions are provided to the protruding portion surface at first electrode positions thereof. Each of the plurality of the protruding portions is for supporting an electrode of the first plurality of electrodes. The substrate surface is for supporting the second plurality of electrodes. The second plurality of electrodes is provided to the substrate surface at second electrode positions thereof. The first electrode positions corresponding to the second electrode positions so that each of the first plurality of electrodes is brought into electrical contact with a corresponding electrode of the second plurality of electrodes when the contact electrode connector is in a connected condition.

BRIEF DESCRIPTION OF THE DRAWINGS

The above and other objects, features and advantages of the invention will become more apparent from reading the following description of the preferred embodiment taken in connection with the accompanying drawings in which:

FIG. 3(*b*) is a perspective view showing external details of a printer carriage according to the first preferred embodiment for use with the printer shown in FIG. 2;

FIG. 10(b) is a side view showing the positional relationship of the contact electrode to the counter electrode when the rotation angle of the cam follower is 90°;

DETAILED DESCRIPTION OF THE PREFERRED EMBODIMENTS

Figure 1:
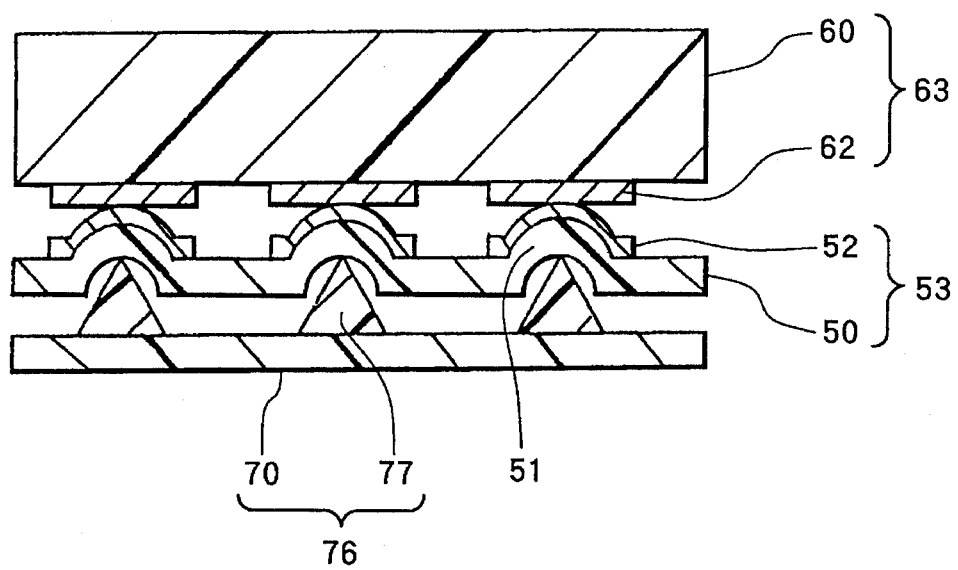
FIG. 1 is a cross-sectional view showing a conventional contact terminal connector.

A printer according to a preferred embodiment of the present invention will be described while referring to the accompanying drawings wherein like parts and components are designated by the same reference numerals to avoid duplicating description.

Figure 2:
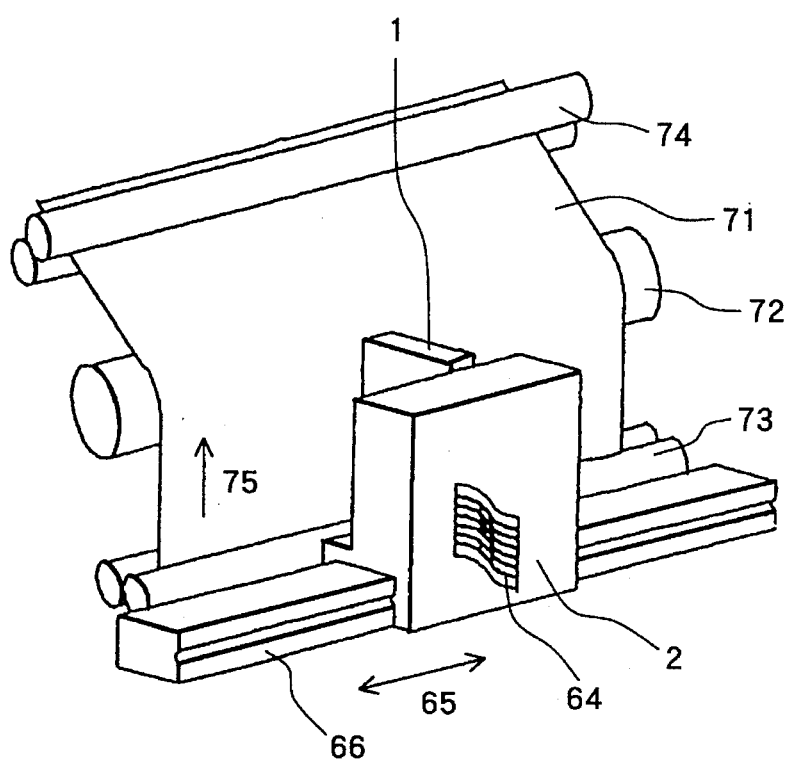
FIG. 2 is a perspective view showing a printer according to a preferred embodiment of the present invention.

FIG. 2 is a perspective view showing the printer according to the preferred embodiment. Although the preferred embodiment describes a printer according to the present invention, the present invention can be used in any situation where electrodes need to be electrically connected with other electrodes.

In the printer according to the preferred embodiment, an ink cartridge 1 is coupled to a carriage 2 when the ink cartridge 1 and the carriage 2 are in a coupled condition to be described later. A flexible cable 64 is provided to the carriage 2 for electrically connecting the carriage 2 with a control portion (not shown) of the printer. A platen roller 72 is provided for supporting a sheet 71 to be printed on and step feeding the sheet 71 lengthwise one line distance at a time in the direction indicated by arrow 75. The carriage 2 is mounted on a slider 66 so as to be returnable movable in the direction indicated by arrows 65 across the widthwise surface of the sheet 71.

To print text or an image on the sheet 71 with the printer shown in FIG. 2, the carriage 2 is scanningly slid along the slider 66 so as to scan the sheet 71 in the widthwise direction. Ink droplets are selectively ejected from the nozzles 30 so as to impinge on the surface of the sheet 71. When the carriage 2 reaches the end of the slider 66, the platen roller 72 transports the sheet 71 one line distance in the lengthwise direction. To print the next line, the carriage 2 is scanned across the sheet 71 either in the opposite direction or, after returning to its starting position, in the same direction while ink droplets are ejected from the nozzles 30.

Details of the structure of the ink cartridge 1 and the carriage 2 will be explained in the following text while referring to FIGS. 3(a), 3(b), 4, and 5. The ink cartridge 1 includes a head for ejecting ink and an ink tank for storing the ink to be ejected, the head being formed integrally with the ink tank. A plurality of nozzles 30 are formed in a nozzle surface 15 of the head. The head can be any type of ink jet print head, for example, the Kaiser head described in Japanese Patent Publication No. SHO-53-12138, The thermal jet head described in Japanese Patent Publication Kokoku No. SHO-61-59914, or the shear mode ink Jet print head which uses piezoelectric ceramic elements as described in Japanese Patent Application Kokai No. SHO-63-247051.

Figure 3:
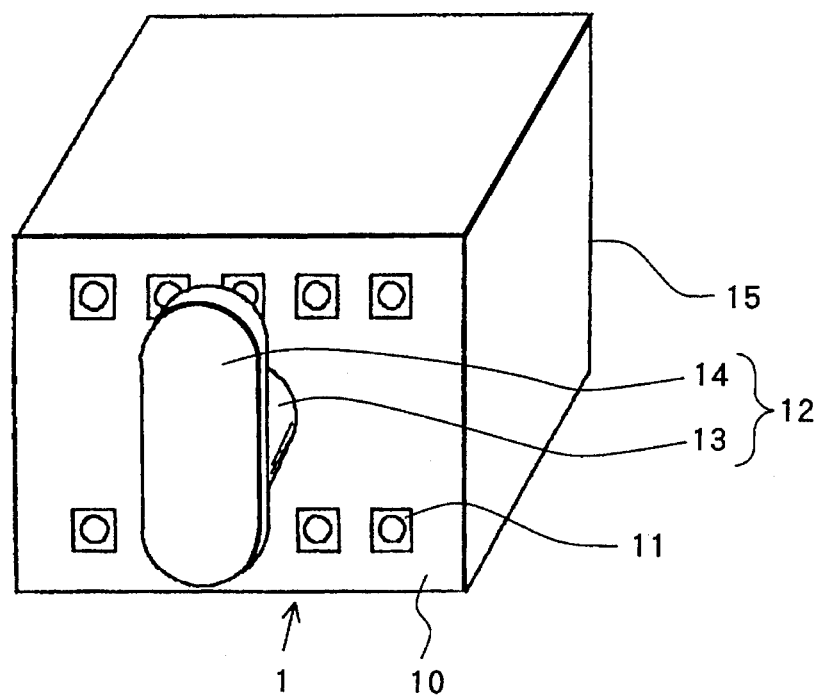
FIG. 3(*a*) is a perspective view showing an ink cartridge according to the first preferred embodiment for use with the printer shown in FIG. 2.
Figure 3:
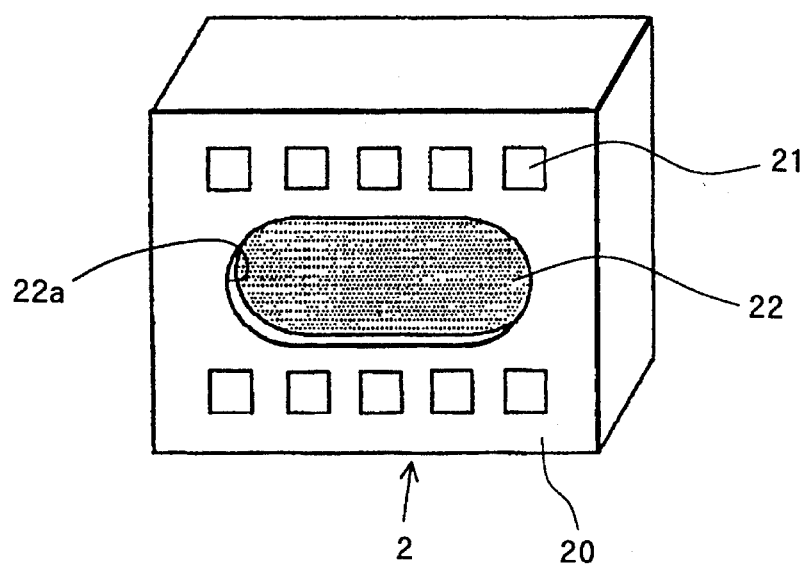

As shown in FIG. 3(a), a contact electrode surface 10 made from a rigid material is provided on the side of the ink cartridge 1 opposite the print nozzle surface 15. Hemispherical raised areas of a flexible resin, such as polymid or polyethylene, are formed at predetermined contact electrode positions on the contact electrode surface 10. A contact electrode 11 is formed on each raised area from a metal such as gold or copper. A back up member (not shown) is formed from a resilient material on the reverse side of each contact electrode 11 for maintaining good electric contact between the contact electrodes 11 and corresponding counter electrodes 21 (to be described later). A cam follower member 12 is formed in the central portion of the contact electrode surface 10. The cam follower member 12 includes a shaft 13 and an oval-shaped cam follower 14 provided to an end of the shaft 13.

As shown in FIG. 3(b), the carriage 2 has a connection electrode surface 20 on which are formed a plurality of counter electrodes 21 from a metal such as gold or copper. The counter electrodes 21 are positioned so as to correspond to positions of the contact electrodes 11 when the ink cartridge 1 and the carriage 2 are in a coupled condition (to be described later). An aperture 22 is formed in the connection electrode surface 20 as defined by an aperture surface 22a. The aperture 22 is formed slightly larger than the cam follower 14 of the ink cartridge 1 so that the cam follower 14 is insertable into the aperture 22.

Figure 4:
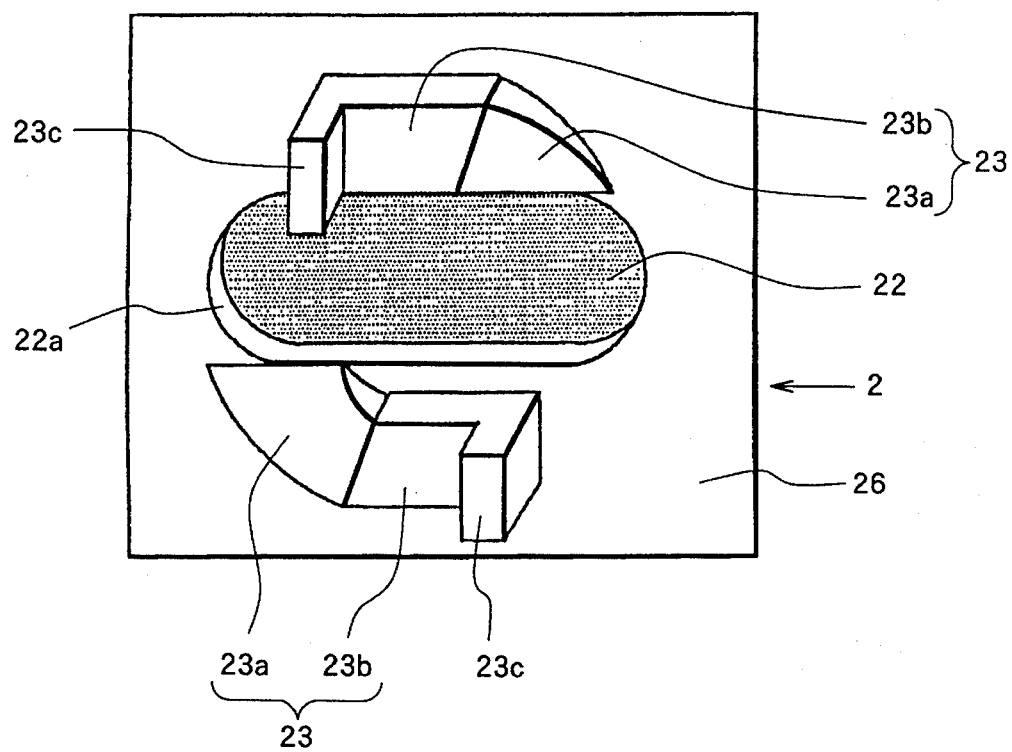
FIG. 4 is a perspective view showing internal details of a printer carriage according to the first preferred embodiment for use with the printer shown in FIG. 2.

As shown in FIG. 4, a cam surface 26 is provided at the interior of the carriage 2 so that the cam surface 26 and the connection electrode surface 20 are on opposite sides of an electrode portion of the carriage 2. The cam surface 26 is connected to the connection electrode surface 20 by the aperture surface 22a. A pair of cams 23c are provided on the cam surface 26 symmetrically arranged on opposite sides of the aperture 22. Each cam 23 includes an inclined surface member 23a, a level surface member 23b, and a stopper 23c. Each level Surface member 23b is integrally formed at one side thereof to an inclined surface member 23a and at another side thereof to a stopper 23c. Each inclined surface member 23a is formed to the cam surface 26 so as to be thinnest, in a direction away from the cam surface 26, where adjacent to the aperture 22 and thickest where integrally formed to the level surface member 23b.

Figure 6:
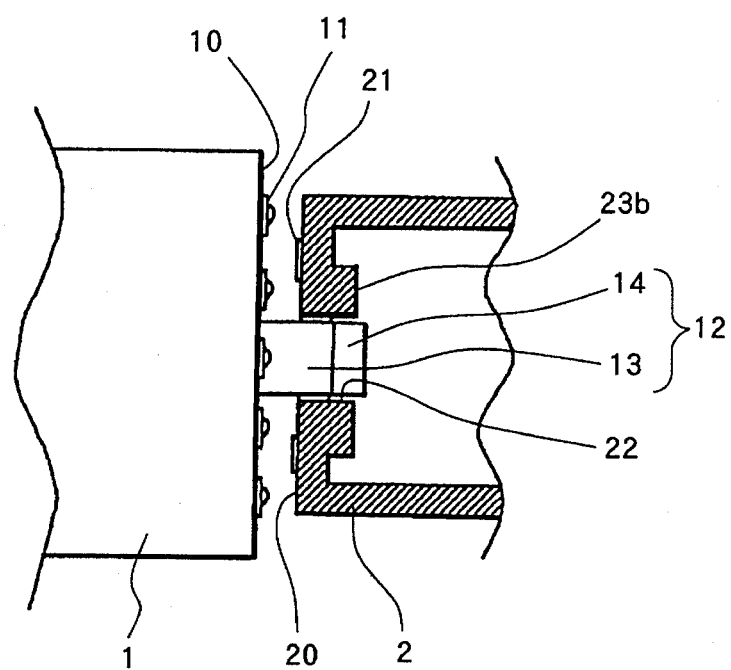
FIG. 6 is a cross-sectional view showing the printer carriage and the ink cartridge in the insertion posture after insertion.
Figure 5:
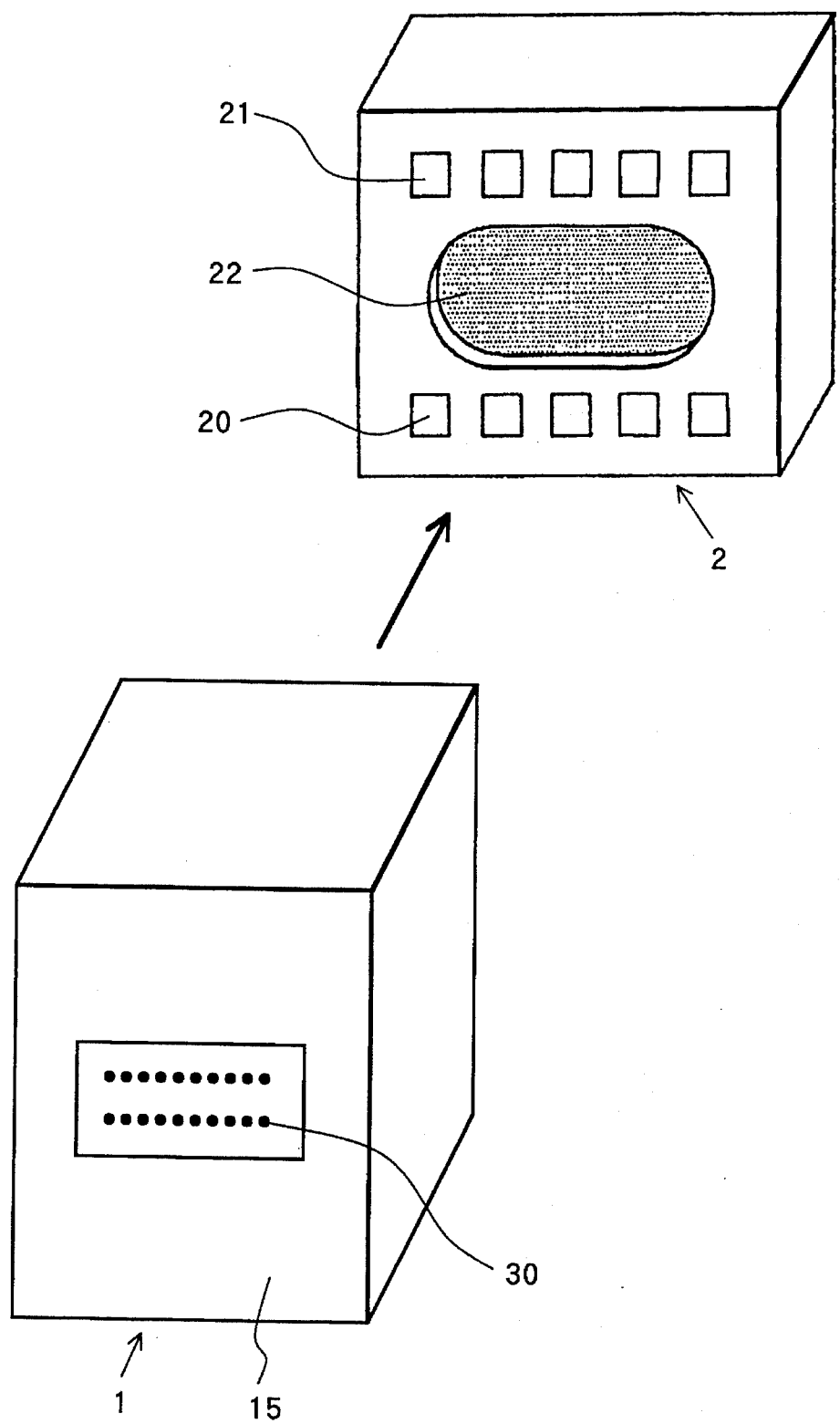
FIG. 5 is a perspective view showing the printer carriage and the ink cartridge in an insertion posture before insertion.

The following text explains an operation for coupling the ink cartridge 1 to the carriage 2 in order to bring the ink cartridge 1 and the carriage 2 into the coupled condition. As shown in FIG. 5, in a first step of the coupling operation, the cam follower 14 is inserted into the aperture 22. As shown in FIG. 6, after the cam follower 14 is inserted in the aperture 22, the contact electrode surface 10 and the connection electrode surface 20 are brought into mutual confrontation. Because of the size and posture of the aperture 22 and the shape and posture of the cam follower 14, the cam follower 14 can only be inserted into the hole of the aperture 22 when the relative positions of the ink cartridge 1 and the carriage 2 are as shown in FIGS. 5 and 6. Therefore, at the end of the first step, the contact electrodes 11 and the counter electrodes are not in contact.

Figure 7:
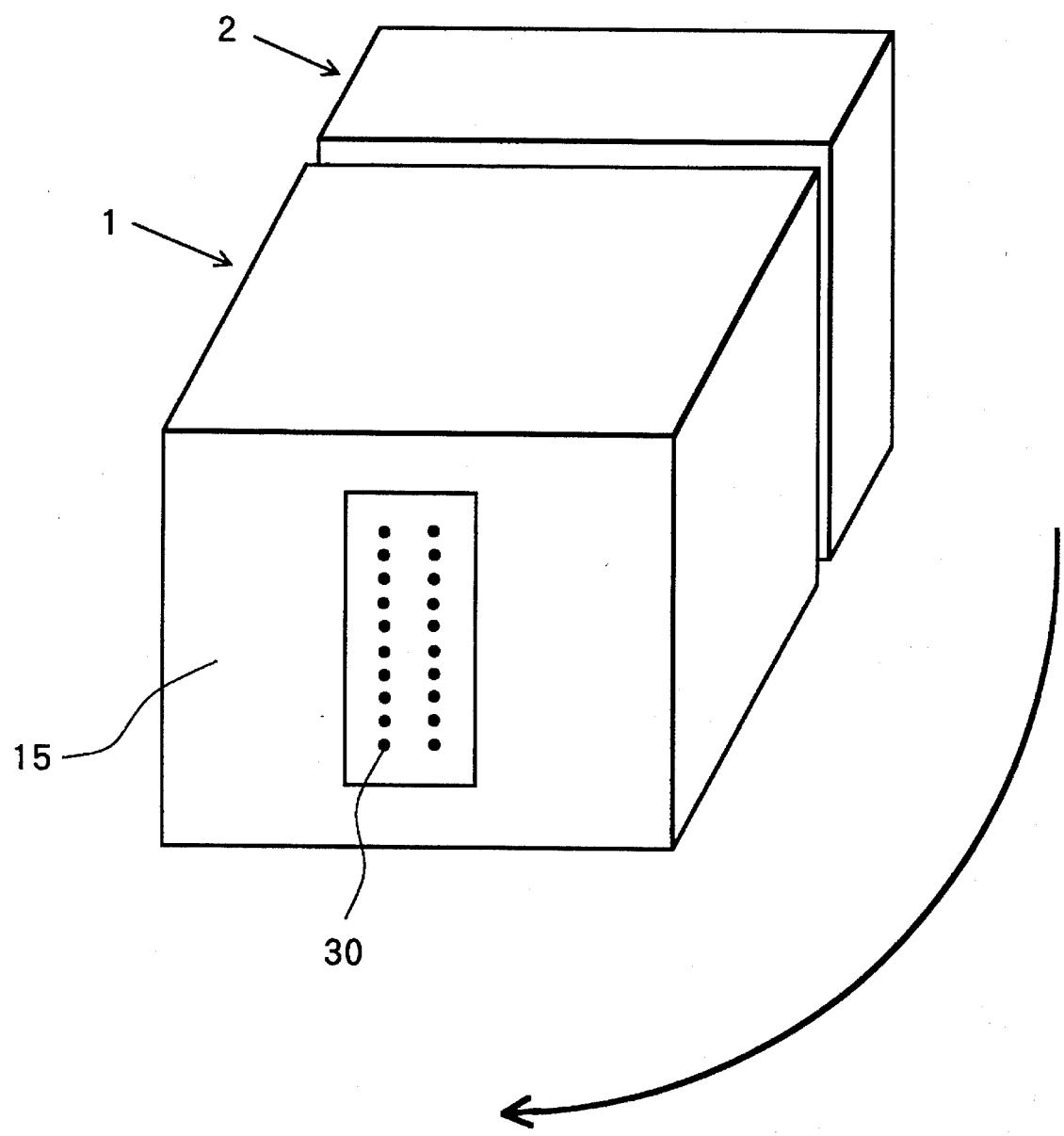
FIG. 7 is a perspective view snowing the printer carriage and the ink cartridge in a coupled posture.
Figure 8:
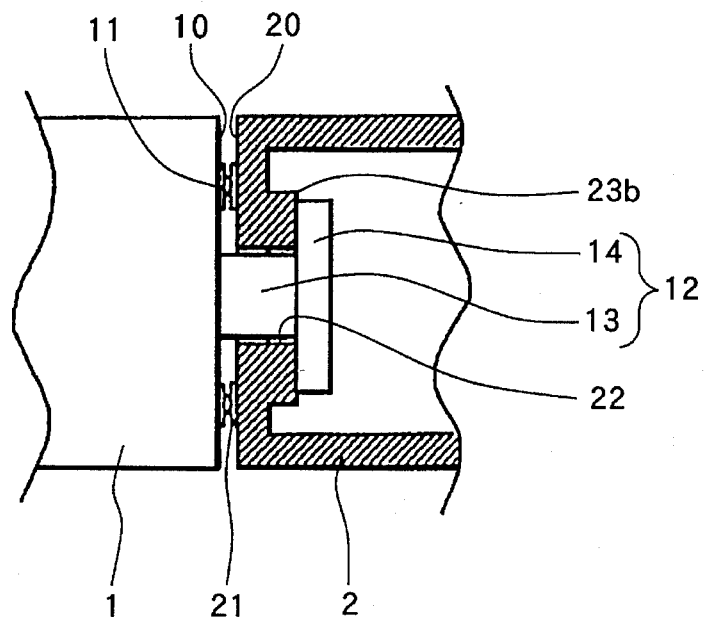
FIG. 8 is a cross-sectional view showing the printer carriage and the ink cartridge in the coupled posture.

As shown in FIG. 7, in the second step of the coupling operation, the ink cartridge 1 is rotated 90° clockwise relative to the carriage 2 with the shaft 13 as the axis of rotation. When the ink cartridge 1 is rotated, the cam follower 14 engages with the pair of cams 23 and follows the pair of cams 23 in a progressive direction. The cams 23 translate the rotation motion of the ink cartridge 1 into a pulling motion that pulls the ink cartridge 1 toward the carriage 2. As shown in FIG. 8, at the end of the second step, the plurality of the contact electrodes 11 of the ink cartridge 1 are pressed with a uniform pressure against corresponding counter electrodes 21 of the carriage 2. Also, the print head is fixed relative to the carriage 2. Because each contact electrode 11 is formed on a raised hemispherical substrate of a flexible resin, contact with corresponding counter electrodes is facilitated. Because the back up member is formed from a resilient material on the reverse side of each contact electrode 11, good electric contact is maintained between the contact electrodes and corresponding counter electrodes.

Figure 9:
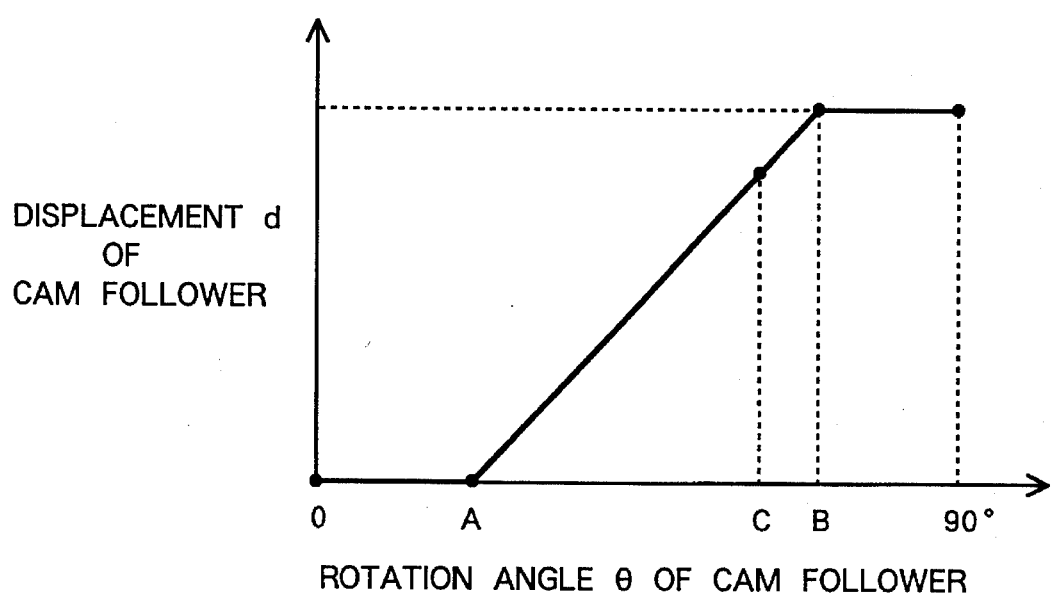
FIG. 9 is a graphical representation of displacement of a cam follower of the ink cartridge versus the rotation angle of the cam follower.
Figure 10:
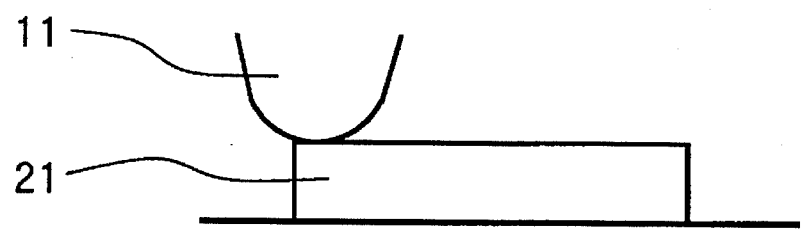
FIG. 10(*a*) is a side view showing the positional relationship of a contact electrode to a counter electrode at a point C in the graph shown in FIG. 9.
Figure 10:
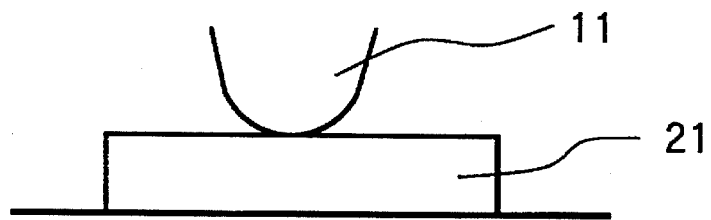

The graph shown in FIG. 9 shows the effect of the rotation angle β (horizontal axis of the graph) of the cam follower 14 on the displacement d (vertical axis of the graph) of the cam follower 14 in the axial direction of the shaft 13. As shown in the graph, no displacement d of the cam follower 14 occurs during the first atop of the coupling operation because the cam follower 14 does not contact the pair of cams 23. Displacement d begins at point A after the cam follower 14 is brought into contact with the cams 23 by rotation of the cam follower 14. Point C represents the point when the contact electrodes 11 first come into contact with the counter electrodes 21 as shown in FIG. 10(a). After point C, rotation of the cam follower 14 continues to increase displacement of the cam follower 14 until the cam follower 14 attains the level surface members 23b whereupon displacement reaches a maximum as represented by point B. When the rotation angle β of the cam follower 14 is 90°, the tip surface of the cam follower 14 abuts the stoppers 23c, whereupon further progressive movement of the cam followers is prevented and the coupling operation is completed. When the ink catridge 1 to the carriage 2 are in the coupled condition at completion of the coupling operation, contact electrodes 11 and corresponding counter electrodes 21 are in contact as shown in FIG. 10(b). The ink cartridge 1 can be separated from the carriage 2 by following the above operation in reverse.

Because the contact electrodes 11 are in contact with the counter electrodes 21 when the rotation angle of the cam follower 14 is between point C and 90°, the contact electrodes 11 rubbed (rubbingly moves) across the counter electrodes 21 under pressure caused by the rotation movement. This rubbing action removes corrosion or films of insulating organic material from the surface of the contact electrodes 11. Moreover, by forming the contact electrode connector so that the contact electrodes 11 are rubbed across corresponding counter electrodes 21 at a predetermined pressure, good electrical connection is ensured between the contact electrodes 11 and the counter electrodes 21. Good electric contact can be also be obtained by forming the level surface members 23b to a predetermined thickness sufficient to ensure good contact. The stoppers 23c effectively limit rotation movement of the cam follower 14 so that the position of the contact electrodes 11 can be fixed with good repeatability.

In an ink jet printer according to the preferred embodiment, the contact electrodes 11 that are formed on a protruding flexible resin substrate are provided to the replaceable ink cartridge. Therefore, the contact electrodes 11 are usually replaced with the ink cartridge 1 before they were out. Therefore, problems caused by poor contact between the contact electrodes 11 and the counter electrodes 21, problems such as poor quality of printed images and characters caused when nozzles do not eject properly, are prevented. Even if the contact electrodes 11 are damaged or abraded before the ink cartridge 1 is replaced, a user can easily replace the ink cartridge 1 in the same manner as though it had run out of ink. The present invention saves costs for professionally repairing the printer this problem would conventionally require.

Figure 11:
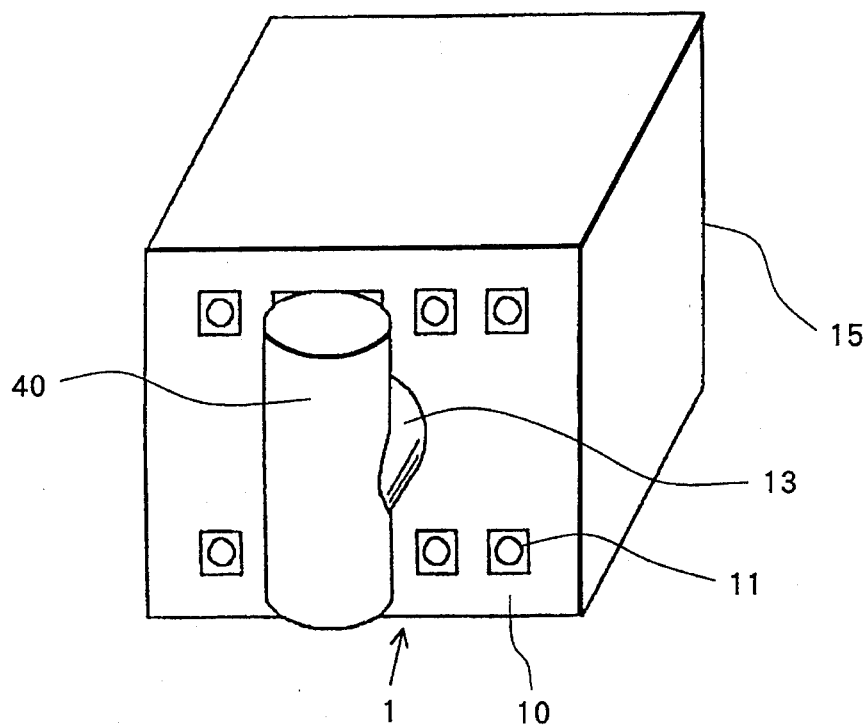
FIG. 11 is a perspective view showing an ink cartridge according to a first modification of the preferred embodiment.

The following text describes a first modification of the preferred embodiment. In the first modification of the preferred embodiment, a cylindrical cam follower 40 is provided to the shaft 13 as shown in FIG. 11. Also, a linear U-shaped positioning groove (not shown) is provided to each of the level surface members 23b. The positions of the positioning grooves corresponds to the position where the cam follower 40 will rest after the ink cartridge 1 and the carriage 2 are in the coupled condition. Portions of the cam follower 40 on either side of the shaft 13 contact corresponding cams 23 along a linear surface. Therefore, when the contacting portions of the cam follower 40 attain corresponding linear positioning grooves at the coupled condition, the contacting portions will fit into corresponding positioning grooves, thereby ensuring precision during repeated positioning of the carriage 2 relative to the ink cartridge 1. Shifting of the position of the carriage 2 relative to the ink cartridge 1 will be reduced or prevented even if the carriage and the print head undergo repeated acceleration and vibration during printing. The operator will be able to feel the cam 40 fitting into or pulling out of the groove when connecting or disconnecting the ink cartridge 1 and so will be able to know the ink cartridge 1 is mounted correctly.

Figure 12:
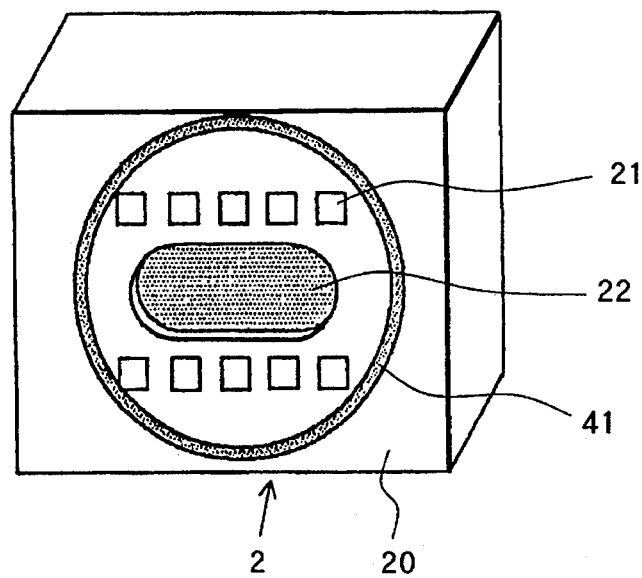
FIG. 12 is a perspective view showing a printer carriage according to a second modification of the preferred embodiment.

The following text describes a second modification of the preferred embodiment wherein a resilient member 41, for example, an O-ring, is formed to the connection electrode surface 20 of the carriage 2 as shown in FIG. 12. The resilient member 41 is provided so as to surround the counter electrodes 21. Therefore when the ink cartridge 1 and the carriage 2 are coupled, the area around the contact electrodes 11 and the counter electrodes 21 is sealed. This prevents the contact electrodes 11 from being dirtied by ink that drips from an ink tank during exchange thereof or that leaks during continuous operation of the printer.

Figure 13:
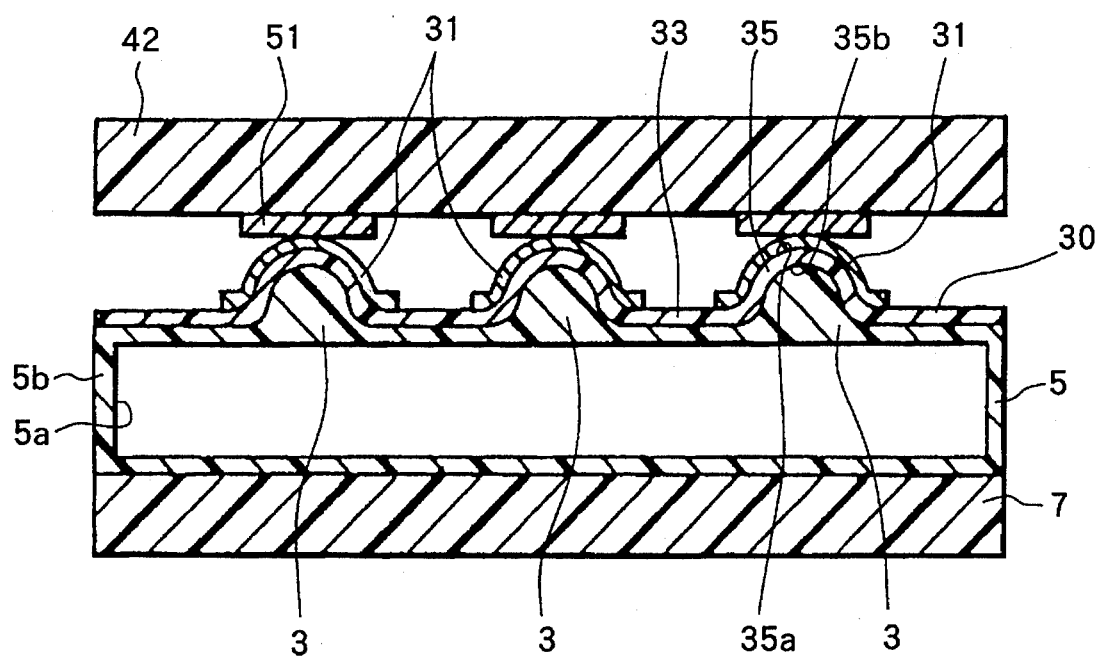
FIG. 13 is a perspective view showing a contact electrode connector according to a third modification of the preferred embodiment.

A third modification of preferred embodiment will be explained in the following text while referring to FIG. 13. In the third modification, a flat support plate 7 formed form a rigid resin compound is provided to the carriage (not shown). A fluid chamber body 5 formed from a resiliently deformable resin compound is provided to the flat surface of the support plate 7. The fluid chamber body 5 includes a partition 5b, formed from a sufficiently pliable material, and an fluid chamber 5a defined by the partition 5b. The fluid chamber 5a could be filled with air or any other fluid. The partition 5b isolates the fluid chamber 5a from the atmosphere. The thickness of the support board 7 is set so that when the head is mounted to the carriage a slight pressure is applied to the fluid chamber 5a.

Hemispherical protruding portions 3 are formed to the partition 5b at the surface of the fluid chamber body 5 that is opposite the surface confronting the support plate 7. The protruding portions 3 are formed so as to protrude away from the fluid chamber 5a. A resin substrate 33 of a flexible circuit 30 is formed from a flexible resin onto the surface of the fluid chamber body 5 which includes the protruding portions 3. The resin substrate 33 is formed to the protruding portion surface of the partition 5b so as produce indented surfaces 35b in the resin substrate 33 that conform to the shape of the protruding portions 3, thereby producing hemispherical substrate protrusions 35. A contact electrode 31 is formed to each substrate protrusion 35 so that the contact electrodes 31 conform to the hemispherical shape of corresponding substrate protrusion 35.

Counter electrodes 51 are provided to the exposed surface of the head substrate 42. The counter electrodes 51 are formed at positions on the head substrate that correspond with positions of the contact electrodes 31 when the ink cartridge 1 and the carriage 2 are in the coupled condition.

In a contact electrode connector 1 structured as described in the third modification, the air chamber body 5 equalizes stress applied between the contact electrodes 31 and the counter electrodes 51. Accordingly a substantially uniform stress is applied between each contact electrode 31 and its corresponding counter electrode 51 so that good electrical contact between the contact electrodes 31 and corresponding counter electrodes 51 can be obtained.

Figure 14:
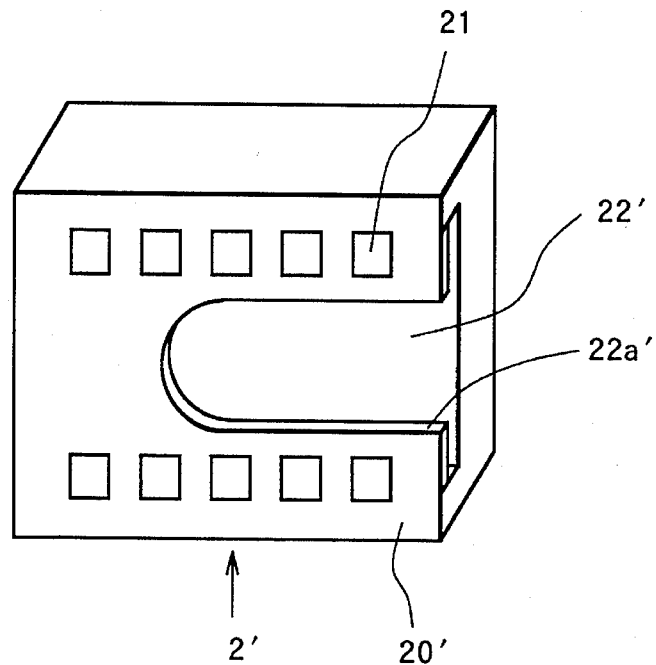
FIG. 14(a) is a perspective view showing external details of a printer carriage according to a fourth modification of the preferred embodiment.
FIG. 14(b) is a perspective view showing internal details of the printer carriage according to a fourth modification of the preferred embodiment.
Figure 14:
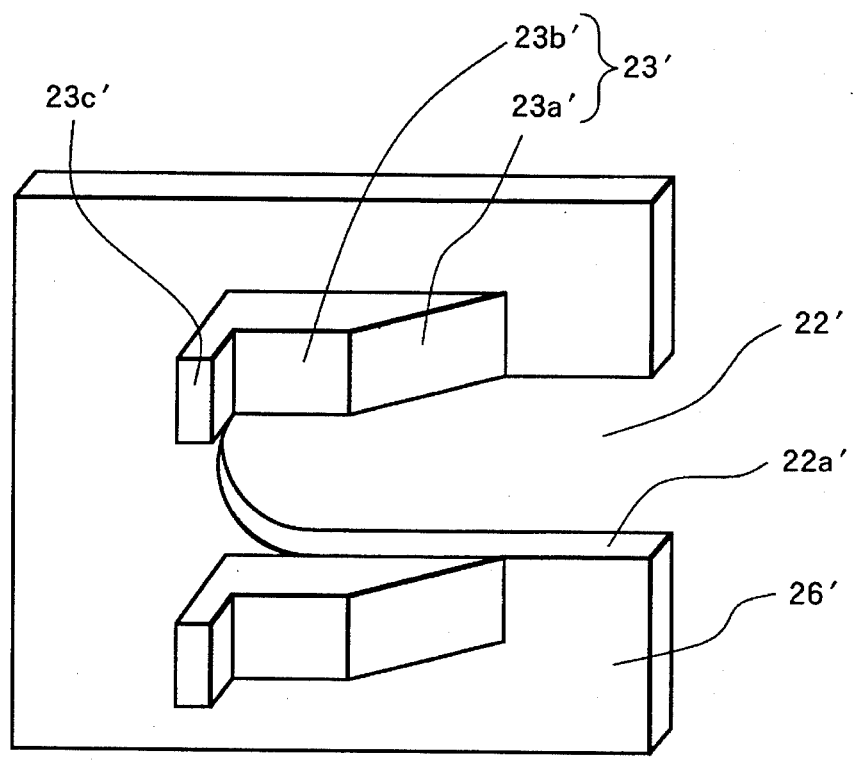

In the preferred embodiment and its first and second modifications, the cam follower 14 was brought into engagement with the cams 23 by rotating the ink cartridge 1 clockwise 90° after inserting the cam follower 14 into the aperture 22. However, in a fourth modification of preferred embodiment, an aperture 22' and cams 23' are provided as shown in FIGS. 14(a) and 14(b). In the fourth modification, the cam follower 14 are brought into engagement with the cams 23' by sliding the cam follower 14 along the cams after inserting the cam follower 14 into the aperture 22'. With this structure, the plurality of the contact electrode 11 can also be slidingly and rubbingly pressed at a uniform pressure to corresponding counter electrodes 21.

While the invention has been described in detail with reference to a specific embodiment and modifications thereof, it would be apparent to those skilled in the art that various changes and further modifications may be made therein without departing from the spirit of the invention.

For example, although in the preferred embodiment and its first, second, and fourth modifications the hemispherical contact electrodes 11 are described as being provided to the ink cartridge 1 and the counter electrodes 21 are described as being provided to the carriage 2, the hemispherical contact electrodes 11 could be provided to the carriage 2, and the counter electrodes 21 could be provided to the ink cartridge 1.

In the third modification the hemispherical contact electrodes 32 are described as being provided to the carriage 2 and the counter electrodes 51 are described as being provided to the ink cartridge 1. However, the hemispherical contact electrodes 32 could be provided to the ink cartridge 1 and the counter electrodes 51 could be provided to the carriage 2. In this case, signal lines (not shown) would be provided to connect a control circuit (not shown) to the counter electrodes 51 on the carriage 2. The flexible circuit 30 would be provided to connect the counter electrode 51 with the thermal resistors formed to the interior of the print head. The support plate 7, the air cheer body 5, and the flexible circuit 30 would be positioned in this order to the surface of the head 1, and not the surface of carriage 2 as shown in FIG. 13.

In the preferred embodiment and its modifications, the ink cartridge 1 including a head and an ink tank was described as being provided detachably to the carriage 2. However, a head including contact electrodes 11 can be provided separately from an ink tank, with both being separately detachably mountable to the carriage.

Although the preferred embodiment and its first, second, and fourth modifications describes the cam follower member 12 as being provided to the ink cartridge 1, the cam follower member 12 could be provided to the carriage 2. Also, either or both of the apertures 22 and 22' and either or both of the cams 23' could be provided to the ink cartridge 1. Cam follower members, apertures, and cams could also be provided to both the ink cartridge 1 and the carriage 2.

In the preferred embodiment and its first, second and fourth modifications hemispherical raised areas for supporting the contact electrodes 11 are formed from a flexible resin on a rigid contact electrode surface 10. However, hemispherical raised areas could be formed directly from a flexible contact electrode surface 10 and contact electrodes 11 formed to these.

In the third modification a level support plate 7 was used to support the air chamber body 5. However, other types of support members can be used. For example, the carriage surface itself can be used as a support member. Additionally, although the air chamber 5a was described as a continuous chamber behind all the protruding portions 3, individual air chambers 5a could be provided behind each protruding portion 3. However in this case, individual air chambers should be fluidly connected or separated only by a thin film, for example, so that changes in pressure in one air chamber would be transmitted to adjacent air chambers.

In the third modification, the contact electrodes 31 were described as being provided to a pliable resin substrate 33. However, the resin substrate 33 does not have to be pliable. When the contact electrodes 31 are formed to a fairly uniform height with little variance, the contact electrodes 31 could be provided to a surface of a rigid resin substrate. For example, if the support plate 7 and the head substrate 42 are not parallel to each other while in a coupled condition, and therefore the distance between the plate 7 and the substrate 42 is not uniform, the thickness of the air chamber 5a will be compressed by different amounts that correspond to the differing distances between the support plate 7 and the head substrate 42. As a result, a substantially uniform stress is applied between all contact electrodes 31 and corresponding counter electrodes 51, thereby ensuring good contact.

The cam follower 14 of the cam follower member 12 could also be formed in shapes other than the oval shape and the cylindrical shape described in the preferred embodiment and its first modification.

What is claimed is:

1. A contact electrode connector comprising:

a first electrode portion having a first electrode surface, a cam surface, and an aperture surface, the first electrode surface and the cam surface being on opposite sides of the first electrode portion, the aperture surface defining an aperture in the first electrode portion and connecting the first electrode surface and the cam surface;

a first plurality of electrodes provided at first electrode positions on the first electrode surface;

a cam provided on the cam surface;

a second electrode portion having a second electrode surface;

a cam follower member having a shaft and a cam follower, the shaft having an end and an opposite end, the end of the shaft being attached to the second electrode surface, the cam follower being attached to the opposite end of the shaft, the cam follower member being shaped so that the cam follower is insertable through the aperture when the first electrode portion and the second electrode portion are in an insertion posture, and so that, after insertion through the aperture, the cam follower will follow a surface of the cam when the first electrode portion and the second electrode portion are moved from the insertion posture to a coupled posture, the first electrode surface moving towards the second electrode surface as the cam follower follows the surface of the cam; and a second plurality of electrodes provided on the second electrode surface at second electrode positions that correspond to the first electrode positions when the first electrode portion and the first electrode portion are in a coupled posture, each electrode of the second plurality electrodes rubbingly coming into contact with a corresponding electrode of the second plurality of electrodes when the first electrode portion and the second electrode portion move into the coupled posture.

2. A contact electrode connector as claimed in claim 1 wherein the shaft of the cam follower member has an axis, and wherein the second electrode portion is rotated about the axis of the shaft to move the first electrode portion and the second electrode portion from the insertion posture to the coupled posture, 3. A contact electrode connector as claimed in claim 2 wherein the cam follower has a contacting portion which contacts the cam when the first electrode portion and the second electrode portion move from the insertion posture to the coupled posture, wherein the surface of the cam includes a groove portion defining a groove positioned so that the contacting portion of the cam follower fits into the groove when the first electrode portion and the second electrode portion are in the coupled posture.

4. A contact electrode connector as claimed in claim 1 wherein the cam follower has a contacting portion which contacts the cam when the first electrode portion and the second electrode portion move from the insertion posture to the coupled posture, wherein the surface of the cam includes a groove portion defining a groove positioned so that the contacting portion of the cam follower fits into the groove when the first electrode portion and the second electrode portion are in the coupled posture.

5. A contact electrode connector are claimed in claim 1 wherein the cam has a stopper provided thereto, the stopper being positioned on the cam so that the cam follower will abut the stopper when the first electrode portion and the second electrode portion are in the coupled posture, the stopper thereby preventing further progressive movement of the cam follower after the first electrode portion and the second electrode portion are brought into the coupled posture.

6. A connector as claimed in claim 1 further comprising:
a resilient member provided to the first electrode surface so as to encompass but not cover the first plurality of electrodes on the first electrode surface, the resilient member coming into sealing contact with the second electrode surface when the first electrode portion and the second electrode portion are in the coupled posture so as to form a sealed area enclosing the first plurality of electrodes and the second plurality of electrodes.

7. A connector as claimed in claim 1 further comprising:
a resilient member provided to the second electrode surface so as to encompass but not cover the second plurality of electrodes on the second electrode surface, the resilient member coming into sealing contact with the second electrode surface when the first electrode portion and the second electrode portion are in the coupled posture so as to form a sealed area enclosing the first plurality of electrodes and the second plurality of electrodes.

8. A contact electrode connector as claimed in claim 1 wherein the first electrode portion is integrally formed with a carriage, the carriage being reciprocally movably mounted to a printer.

9. A contact electrode connector as claimed in claim 1 wherein the second electrode portion is integrally formed with a carriage, the carriage being reciprocally movably mounted to a printer.

10. A contact electrode connector as claimed in claim 1 wherein the first electrode portion is integrally formed with a print head, the print head being detachably mountable to a printer.

11. A contact electrode connector as claimed in claim 10 wherein the print head is integrally formed to an ink tank for storing ink to be ejected from the print head.

12. A contact electrode connector as claimed in claim 10 wherein the print head is formed so as to detachably mounted to an ink tank for storing ink to be ejected from the print head.

13. A contact electrode connector as claimed in claim 1 wherein the second electrode portion is integrally formed with a print head, the print head being detachably mountable to a printer.

14. A contact electrode connector as claimed in claim 13 wherein the print head is integrally formed to an ink tank for storing ink to be elected from the print head.

15. A contact electrode connector as claimed in claim 13 wherein the print head is formed so as to detachably mounted to an ink tank for storing ink to be ejected from the print head.

16. A contact electrode connector as claimed in claim 1 further comprising:
a fluid chamber partition formed from a resilient material between the first electrode surface and the cam surface, the fluid chamber partition having an inner surface and an outer surface, the inner surface defining a fluid chamber filled with a fluid, the outer surface including the first electrode surface and a cam surface support portion on opposite sides of the fluid chamber, the cam surface support portion supporting the cam surface; and a plurality of protruding portions provided to the first electrode surface at first electrode positions thereof, each of the first plurality of electrodes being formed on a protruding portion of the plurality of protruding portions.

17. A contact electrode connector as claimed in claim 1 wherein the second electrode portion further has a support member and a fluid chamber partition formed on the support member from a resilient material, the fluid chamber partition having an outer surface and an inner surface, the inner surface defining a fluid chamber filled with a fluid, the outer surface including the second electrode surface and a support member confronting surface on opposite sides of the fluid chamber, the support member confronting surface confronting the support member; and wherein the contact electrode connector further comprises a plurality of protruding portions provided to the second electrode surface at first electrode positions thereof, each of the second plurality of electrodes being formed on a protruding portion of the plurality of protruding portions.

18. A contact electrode connector for bringing each of a first plurality of electrodes into electrical contact with a corresponding electrode of a second plurality of electrodes when the contact electrode connector is in a connected condition, the contact electrode connector comprising:

a support member;

a fluid chamber partition formed on the support member from a resilient material, the fluid chamber partition having an outer surface and an inner surface, the inner surface defining a fluid chamber filled with a fluid, the fluid chamber partition isolating the fluid chamber from atmosphere, the outer surface including a protruding portion surface and a support member confronting surface on opposite sides of the fluid chamber, the support member confronting surface confronting the support member;

a plurality of protruding portions provided on the protruding portion surface at first electrode positions thereof, each of the plurality of protruding portions supporting an electrode of the first plurality of electrodes; and a substrate surface for supporting the second plurality of electrodes, the second plurality of electrodes being provided to the substrate surface at second electrode positions thereof, the first electrode positions corresponding to the second electrode positions so that each of the first plurality of electrodes is brought into electrical contact with a corresponding electrode of the second plurality of electrodes when the contact electrode connector is in a connected condition.

19. A contact electrode connector as claimed in claim 18, wherein the plurality of protruding portions are formed on the protruding portion surface of the fluid chamber partition.

20. A contact electrode connector as claimed in claim 19, further comprising:

a carriage which includes the substrate surface for supporting said second plurality of electrodes; and a head detachably mounted to said carriage, said head including the support member on which said plurality of protruding portions are provided.

21. A contact electrode connector as claimed in claim 20, wherein the head includes a configuration for ejecting ink.

22. A contact electrode connector as claimed in claim 21, further comprising an ink tank for storing ink, wherein the head and the ink tank are separate components.

23. A contact electrode connector as claimed in claim 21, further comprising an ink tank for storing ink, wherein the head and the ink tank are integrally formed.

24. A contact electrode connector as claimed in claim 19, further comprising:

a carriage which includes the support member to which said plurality of protruding portions are provided; and a head detachably mounted to said carriage, said head including the substrate surface for supporting said second plurality of electrodes.

25. A recording mechanism for recording images and characters, said recording mechanism comprising:

a movable carriage;

a plurality of opposing electrodes provided at positions on the carriage;

a head detachably mounted to the carriage, the head including a substrate;

a plurality of protruding portions formed from a flexible material on the substrate at positions corresponding to positions of the plurality of opposing electrodes;

a contact electrode provided on each protruding portion, each contact electrode being brought into electrical connection with a corresponding one of the opposing electrodes when the contact electrodes are pressed against the opposing electrodes, wherein each of said contact electrodes includes a pressing member for applying pressure against a rear surface of a corresponding contact electrode so as to press the corresponding contact electrode against a corresponding opposing electrode, and each pressing member includes a resilient member and a fluid chamber.

26. A recording mechanism as claimed in claim 25, wherein the contact electrodes are integrally provided on the substrate of the head.

27. A recording mechanism as claimed in claim 26, wherein the head includes a configuration for ejecting ink.

28. A recording mechanism as claimed in claim 27, further comprising an ink tank integrally formed on the head.

29. A recording mechanism as claimed in claim 27, further comprising an ink tank detachably provided on the head.

30. A recording mechanism as claimed in claim 25, wherein the opposing electrodes are fixedly provided on the carriage.

31. A contact electrode connector as claimed in claim 18, wherein pressure applied to each of said protruding portions is evenly distributed among all the protruding portions through the fluid in said fluid chamber.

32. A contact electrode connector as claimed in claim 18, wherein the fluid chamber does not contain ink.

* * * * *